United States Patent [19]

Long

[11] Patent Number: 4,790,897

[45] Date of Patent: Dec. 13, 1988

[54] DEVICE FOR BONDING OF LEAD WIRES FOR AN INTEGRATED CIRCUIT DEVICE

[75] Inventor: Jon Long, Livermore, Calif.

[73] Assignee: LSI Logic Corporation, Fremont, Calif.

[21] Appl. No.: 43,894

[22] Filed: Apr. 29, 1987

[51] Int. Cl.⁴ ............................................. B32B 31/26
[52] U.S. Cl. ..................................... 156/350; 29/843;
29/846; 29/850; 29/874; 228/4.5; 156/382;
156/556; 156/566; 269/21; 279/3
[58] Field of Search ................ 269/21; 279/3; 51/235;
228/179, 4.5, 6.2, 44.3; 29/402.09, 402.11,
402.13, 402.16, 825, 829, 830–831, 842–843,
846–847, 850, 874; 156/285, 286, 381, 382,
272.2, 297, 299, 350, 352, 358, 361, 379.6, 379.8,
380.6, 380.9, 556, 559, 560, 562, 566

[56] References Cited

U.S. PATENT DOCUMENTS

| 2,781,554 | 2/1957 | Robinson | 51/235 |
| 3,654,019 | 4/1972 | Cusik | 156/382 |
| 3,812,581 | 5/1974 | Larson | 228/179 |
| 4,050,618 | 9/1977 | Angelucci | 228/6.2 |
| 4,627,151 | 12/1986 | Mulholland | 228/4.1 |

FOREIGN PATENT DOCUMENTS 0751253 6/1956 United Kingdom ................. 51/235

Primary Examiner—Merrell C. Cashion, Jr.
Attorney, Agent, or Firm—Nathan N. Kallman; Alan H. MacPherson; Paul J. Winters

[57] ABSTRACT

Bonding of lead wires between electrical contact points of an integrated circuit and the conductive elements of a flexible tape-like structure on which the integrated circuit is seated is accomplished by means of a vacuum chuck having distributed recesses through which a partial vacuum is applied to the flexible structure. Support elements are provided with the vacuum recesses to ensure that the flexible tape-like structure presents a planar orientation to a bonding tool. The tape-like structure is maintained in a substantially rigid position during the bonding process enabling precision bonding of lead wires.

5 Claims, 1 Drawing Sheet

DEVICE FOR BONDING OF LEAD WIRES FOR AN INTEGRATED CIRCUIT DEVICE

CROSS-REFERENCE TO COPENDING U.S. PATENT APPLICATION

In co-pending U.S. patent application Ser. No. 07/008,208 entitled "Support Assembly for Integrated Circuits" filed on Jan. 28, 1987, on behalf of V. K. Sahakian et al. and assigned to the same assignee, an integrated circuit support assembly is disclosed. The patent application describes an integrated circuit package which includes a composite support assembly formed with a rigid lead frame and a thin flexible tape-like structure having inner and outer lead fingers for connection to the IC bonding pads and to external circuitry. The present invention is applicable for use with the structure disclosed in the cited patent application, which is incorporated herein by reference.

BACKGROUND OF THE INVENTION

1. Field of the Invention

This invention relates to the production of integrated circuit (IC) devices and in particular to a method of bonding lead wires to the IC for providing electrical signal paths.

2. Description of the Prior Art

In the typical process of producing IC devices, an IC die which has IC logic circuits formed on its surface, is attached to a die attach pad of a lead frame. The lead frame has a number of electrically conductive elements or fingers that are connected to the IC circuits by lead wires which are bonded to contact points or bonding pads of the IC circuits A large number of wires need to be bonded to the IC die surface and to the attach pad, which are relatively small in dimension. With the present approach to mass production of IC devices at high speeds and low cost, automated bonding apparatus which is under control of a microcomputer is employed. T implement the wire bonding process successfully, it is necessary that the wire bonding points be fixed precisely in position so that there will not be any electrical circuit shorting or erroneous connections to the IC elements.

When the IC die is attached to a flexible tape-like structure, such as disclosed in the aforementioned patent application, the flexible structure has a tendency to float and vibrate so that during the wire bonding process accurate fixed positioning of the conductive elements formed with the structure is difficult. Prior art approaches to wire bonding to a lead frame utilize a window clamp to fix the frame and associated conductive elements in a rigid position. However, a window clamp which attaches to the periphery of a flexible structure does not effectively prevent the inner portions of the structure, from vibrating or being displaced from a reference plane. Therefore, bonding of wire leads to an IC assembly, where space is limited and speed of production is highly desirable, poses problems that require effective solutions.

SUMMARY OF THE INVENTION

An object of this invention is to provide a method and means for maintaining an IC device and its associated conductive elements in a fixed position during the wire bonding process.

In accordance with this invention, a process for bonding lead wires to an IC device that incorporates a flexible tape-like structure serving as the IC die attach pad employs a vacuum means to effectively hold the tape-like structure in a fixed position. The vacuum means provides a substantially uniform vacuum pressure across the surface of the flexible tape, so that the tape is held in a substantially rigid position in a defined plane. In the preferred embodiment, the vacuum means comprises a vacuum chuck formed with a multiplicity of uniformly distributed vacuum cavities that are positioned adjacent to the flexible tape. In this way, automated bonding of lead wires can be effectuated at high speeds at low cost and with virtually no connection errors or electrical shorting problems.

DESCRIPTION OF THE DRAWING

The invention will be described in greater detail with reference to the drawing in which.

DETAILED DESCRIPTION OF THE PREFERRED EMBODIMENT

Figure 1:
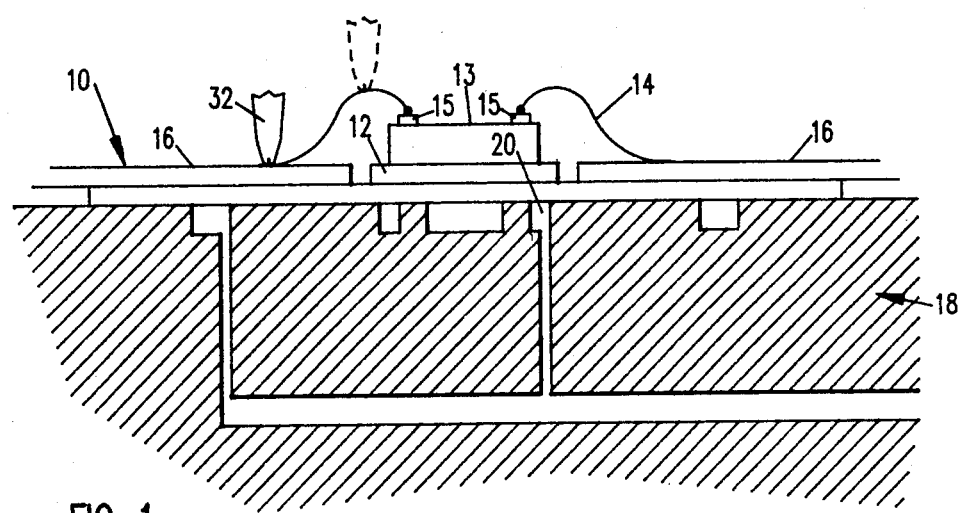
FIG. 1 is a schematic representation of a flexible tape-like structure on which an integrated circuit is positioned.

With reference to the drawing, a flexible tape-like structure 10 supports a die attach pad 12 on which an integrated circuit (IC) 13 is formed. Bond wires 14 are electrically connected to bond pads 15 which are formed on the exposed surface of the IC device, and to inner lead fingers 16 that are formed on the tape-like structure. The inner lead fingers 16 are connected to outer lead fingers that extend to make contact with coupling lead bonds, thereby providing a continuous conductive path from the integrated circuit to external package leads.

Figure 2:
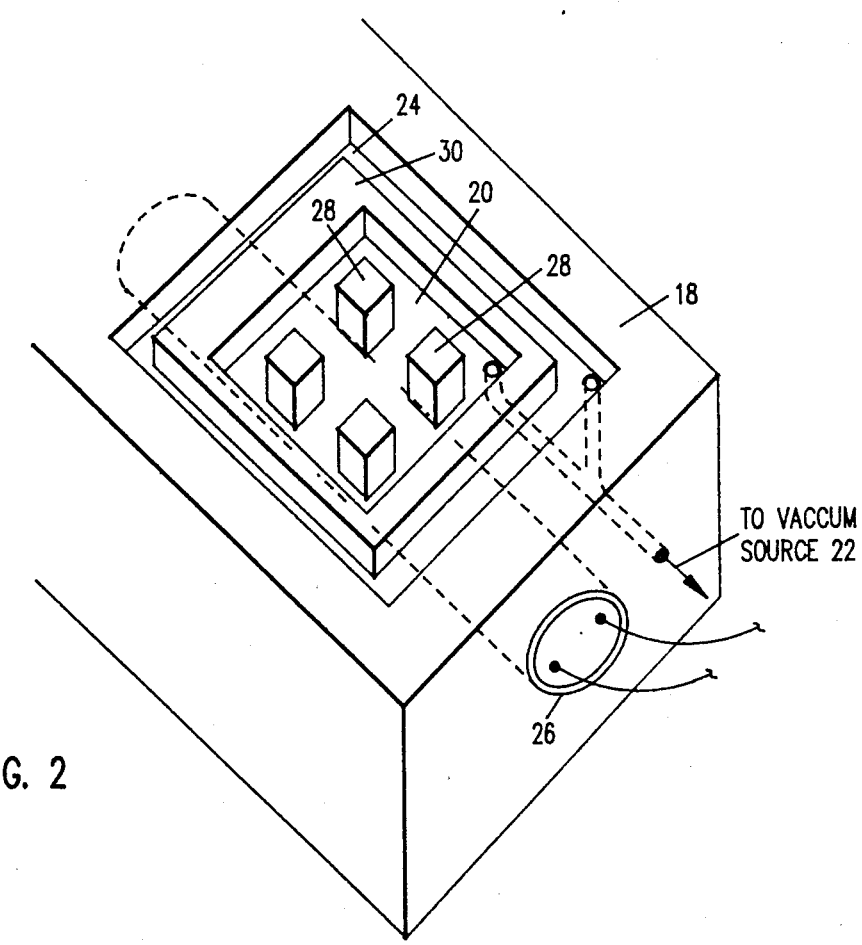
FIG. 2 depicts a vacuum means, such as employed in this invention, to secure the flexible tape-like structure in order to effectuate proper wire bonding.

During the bonding of the connecting lead wires 14, which are very closely spaced, the flexible structure needs to be maintained substantially rigid and stationary. In keeping with this invention, a vacuum assembly comprising a vacuum chuck 18, as illustrated in FIG. 2, is positioned adjacent to the lower tape surface and opposite to the surface on which the bond pads are located. The vacuum chuck has a centrally located cavity encompassed by an outer ring that acts as a supporting bond shelf 30. The shelf support 30 is surrounded by a channel 24. A vacuum source 22 is connected through the body of the vacuum chuck to the central cavity 20 and channel 24 so that when the flexible tape-like structure is positioned against the chuck, the structure is held firmly in place.

To ensure that the tape-like structure is fixed in a substantially planar orientation parallel to the surface of the vacuum chuck, a plurality of supporting posts 28 are provided within the cavity 20. The posts 28 prevent the flexible tape from being drawn into the cavity 20. The posts 28, the shelf 30 and the face or surface of the vacuum chuck 18 are substantially in the same plane, so that the flexible tape lies flat across the surface of the vacuum chuck.

During the bonding process, the vacuum source 22 provides a partial vacuum, 22 inches mercury, for example, through the cavity 20 and channel 24, thereby effectively providing a suction force that holds the tape rigidly in position. A heater 26 that is disposed adjacent to the vacuum chuck is used to heat the metallic chuck 18, so that heat is conducted to enable welding of the wire to the bond pads and lead fingers. The heat is provided if gold wire is used for bonding, whereas if aluminum wire is used, heat is not required. The heating element is preferably disposed within a common housing with the vacuum chuck, but may be separately assembled adjacent to the vacuum chuck for efficient heat exchange.

A bonding tool 32 which is preferably automated and controlled by a microcomputer, acts to bond the wires 14 at precise predetermined positions on the IC die and on the tape-like structure during the bonding process when the vacuum is applied to the flexible tape-like structure. The bonding tool is moved relative to the bond contact points to bond the ends of the wires 14 to the lead fingers and to the IC device. Upon completion of the wire bonding, the vacuum is removed allowing further processing and packaging of the tape and IC assembly.

The vacuum apparatus disclosed herein ensures that the tape-like structure on which the IC bonding pads are located will not move or shift during wire bonding, as was experienced with the window clamp of the prior art. The clamp did not provide a uniformly distributed holding force to the tape structure, and the structure tended to flutter and move during the bonding process. Also, the vacuum apparatus eliminates the need for manual assembly and disassembly, such as is required with the clamp of the prior art, thereby saving labor cost. For mass production of IC assemblies of this type, the yield is significantly improved with this approach to wire bonding.

What is claimed is:

1. Apparatus for bonding lead wires to a flexible tape and an integrated circuit device comprising:

a vacuum chuck structure having a planar face and a central cavity therein:

an annular support shelf disposed within said structure and emcompassing said cavity;

a multiplicity of spaced support posts positioned within said cavity and encompassed by said support shelf;

the top surfaces of said chuck structure, said annular support shelf and said support posts being substantially flat and coplanar;

vacuum means comprising first and second apertured elements for providing a source of vacuum, said first apertured element being disposed within said cavity between said support posts and an inner corner of said support shelf, said second apertured element being disposed between an outer corner of said annular support shelf and said chuck structure so that said flexible tape and integrated circuit device are maintained firmly in place directly on said annular support shelf and said support posts in a substantially planar orientation parallel to the planar face of the chuck structure during a wire bonding procedure.

2. An apparatus as in claim 1, including bonding means for joining said lead wires to said contact points whereby said lead wires are bonded precisely at defined locations.

3. Apparatus as in claim 1, wherein said vacuum chuck is made of a metallic material, and including a heater disposed adjacent to said chuck for heating said vacuum chuck.

4. Apparatus as in claim 1, wherein said vacuum means comprises a source of vacuum connected to said vacuum chuck, and wherein said vacuum source provides a partial vacuum of about 22 inches mercury during the bonding process.

5. Apparatus as in claim 1, including a bonding means for bonding wires to said integrated circuit device, and a microprocessor for controlling said bonding means.

* * * * *